(12) United States Patent
Walukiewicz et al.

(10) Patent No.: US 8,039,740 B2
(45) Date of Patent: Oct. 18, 2011

(54) SINGLE P-N JUNCTION TANDEM PHOTOVOLTAIC DEVICE

(75) Inventors: Wladyslaw Walukiewicz, Kensington, CA (US); Joel W. Ager, III, Berkeley, CA (US); Kin Man Yu, Lafayette, CA (US)

(73) Assignee: RoseStreet Labs Energy, Inc., Phoenix, AZ (US)

( * ) Notice: Subject to any disclaimer, the term of this patent is extended or adjusted under 35 U.S.C. 154(b) by 612 days.

(21) Appl. No.: 11/777,963

(22) Filed: Jul. 13, 2007

(65) Prior Publication Data

US 2008/0314447 A1    Dec. 25, 2008

Related U.S. Application Data

(60) Provisional application No. 60/945,281, filed on Jun. 20, 2007.

(51) Int. Cl.
*H01L 31/042* (2006.01)
(52) U.S. Cl. ........................................ 136/261; 136/262
(58) Field of Classification Search ........... 136/243–265
See application file for complete search history.

(56) References Cited

U.S. PATENT DOCUMENTS

| | | | |
|---|---|---|---|
| 4,321,614 A | 3/1982 | Bluzer | |
| 5,019,177 A | 5/1991 | Wanlass | |
| 5,780,330 A | 7/1998 | Choi | |
| 5,959,307 A | 9/1999 | Nakamura | |
| 6,420,648 B1 | 7/2002 | Lindsey | |
| 7,202,411 B1* | 4/2007 | Wernsman | 136/255 |
| 2005/0012095 A1* | 1/2005 | Niira et al. | 257/41 |

OTHER PUBLICATIONS

Yamaguchi et al., Growth in InN and InGaN on Si substrate for solar cell applications, International symposium on compound semiconductors: Post-conference proceedings, Aug. 25-27, 2003, pp. 214-219.*
"Semiconductor junctions", http://www.soton.ac.uk/~solar/intro/tech4.htm, 1997.*
Low-temperature plasma deposition for flexible plastic electronics and photovoltaics, http://www.imip.cnr.it/wps/?p=181, Dec. 31, 2003.*
Wu et al., Superior radiation resistance of $In_{1-x}Ga_xN$ alloys: full-solar-spectrum photovoltaic material system, Journal of Applied Physics, vol. 94, No. 10, Nov. 15, 2003, pp. 6477-6482.*
Bart Van Zeghbroeck, Principles of Semiconductor Devices, Chapter 2, http://ecee.colorado.edu/~bart/book/book/chapter2/ch2_3.htm, 2007.*

(Continued)

*Primary Examiner* — Jessica L Ward
*Assistant Examiner* — Kevin E Yoon
(74) *Attorney, Agent, or Firm* — Greenberg Traurig LLP; Bradley D. Blanche

(57) ABSTRACT

A single P-N junction solar cell is provided having two depletion regions for charge separation while allowing the electrons and holes to recombine such that the voltages associated with both depletion regions of the solar cell will add together. The single p-n junction solar cell includes an alloy of either InGaN or InAlN formed on one side of the P-N junction with Si formed on the other side in order to produce characteristics of a two junction (2J) tandem solar cell through only a single P-N junction. A single P-N junction solar cell having tandem solar cell characteristics will achieve power conversion efficiencies exceeding 30%.

22 Claims, 4 Drawing Sheets

OTHER PUBLICATIONS

Bruno et al., Low-Temperature Plasma Deposition of Microcrystalline-Silicon and III-Nitride Thin-Films for Flexible Plastic Electronics and Photovoltaics, http://www.cnr.it/istituti/FocusByN_eng.html?cds=054&nfocus=3, 2003.*

Internet Archive showing Publication date of Photovoltaics, http://replay.waybackmachine.org/20050216112104/http://www.cnr.it/istituti/FocusByN_eng.html?cds=054&nfocus=3.*

PCT Notification of Transmittal of the International Search Report and The Written Opinion of the International Searching Authority, or the Declaration, Aug. 29, 2008, 8 Pages.

W. Shan, W. Walukiewicz, J.W. Ager III, "Band Anticrossing in GaInNAs Alloys", Physcial Review Letters, vol. 82, No. 6, Feb. 8, 1999; pp. 1221-1224.

K.M. Yu, W. Walukiewicz, M.A. Scarpulla, O.D. Dubon, J. Wu, J. asinski, Z. Lilental-Weber, J.W. Beeman, M.R. Pillai, M.J. Aziz, Synthesis of $GaN_xAs_{1-x}$ thin films by pulsed laser melting and rapid thermal annealing of $N^+$-implanted GaAs, Journal of Applied Physics, vol. 94, No. 2, Jul. 15, 2003; pp. 1043-1049.

Antonio Luque, Antonio Marti, "Increasing the Efficiency of Ideal Solar Cells by Photon Induced Transistions at Intermediate Levels", Physical Review Letters, vol. 78, No. 26; Jun. 30, 1997; pp. 5014-5017.

Masafumi Yamaguchi, "III-V Compound Multi-Junction Solar Cells: .Present and Future", Solar Energy Materials & Solar Cells; 2002, pp. 261-269.

S.R. Kurtz, D. Myers, J.M. Olson, "Projected Performance of Three- and Four-Junction Devices Using GaAs and GaInP," NREL/CP-520-22925, Sep. 1997; 5 pages.

D.E. Aspnes, "Third-Derivative Modulation Spectroscopy with Low-Field Electroreflectance", Surface Science 37 (1973), p. 418-442.

M. Wolf, "Limitations and Possibilities for Improvement of Photovoltiac Solar Energy Converters*, Part 1: Considerations for Earth's surface Operation", Proceedins of the IRE;. Jul. 1960; pp. 1246-1263.

A. Shik, M. Singh, "Electronic Properties of Semimetallic Heterojunctions", Phys. Stat. Sol., 1998; pp. 195-208.

N.K. Swami, S. Srivastava, H.M. Ghule, "The role of the interfacial layer in Schottky barrier solar cells", J. Phys. D.: Appl. Phys., vol. 12, 1979; pp. 765-771.

H.C. Card, E.S. Yang, P. Panayotatos, "Peaked Schottky-barrier solar cells by Al-Si metallurgical reactions", Applied Physics Letters, vol. 30, No. 12, Jun. 15, 1977; pp. 643-645.

D.L. Pulfrey, R.F. McOuat, "Schottky-barrier solar-cell calculations", Applied Physics Letters, vol. 24, No. 4, Feb. 15, 1974; pp. 167-169.

K.S. Sree Harsha, K.J. Bachmann, P.H. Schmidt, E.G. Spencer, F.A. Thiel, "n-indium tin oxide/p-indium phosphide solar cells", Applied Physics Letters vol. 30, No. 12, Jun. 15, 1977; pp. 645-646.

K.A. Bertness, Sarah R. Kurtz, D.J. Friedman, A.E. Kibbler, C. Kramer, J.M. Olson, "29.5%-efficient GaInP/GaAs tandem solar cells", Applied Physics Letter, 65 (8), Aug. 22, 1994; p. 989-991.

G. Martin, A. Botchkarev, A. Rockett, H. Morkoç, "Valence band discontinuities of wurtzite GaN, AlN, and InN heterojunctions measured by x-ray photoemission spectroscopy", Applied Physics Letter, 68 (18), Apr. 29, 1996; pp. 2541-2543.

J. Wu, W. Walukiewicz, K.M. Yu, W. Shan, J.W. Ager III, E.E. Haller, Hai Lu, William J. Schaff, W.K. Metzger, Sarah Kurtz, "Superior radiation resistance of $In_{1-x}Ga_xN$ alloys: Full-solar-spectrum photovoltaic material system", 2003 American Institute of Physics; pp. 6477-6482.

S.X. Li, K.M. Yu, J. Wu, R.E. Jones, W. Walukiewicz, J.W. Ager III, W. Shan, E.E. Haller, Hai Lu, William J. Schaff, "Fermi-level stabilization energy in group III nitrides".

J. Wu, W. Walukiewicz, K.M. Yu, J.W. Ager III, E.E. Haller, Hai Lu, William J. Schaff, "Small band gap bowing in $In_{1-x}Ga_xN$ alloys", 2005 The American Physical Society; pp. 161201-1-161201-4.

J. Wu, W. Walukiewicz, K.M. Yu, J.W. Ager III, E.E. Haller, Hai Lu, William J. Schaff, Yoshiki Saito, Yasushi Nanishi, "Unusual properties of the fundamental band gap of InN", Applied Physics Letters, vol. 80, No. 21, May 27, 2002; pp. 3967-3969.

W. Walukiewicz, J.W. Ager III, K.M. Yu, Z. Liliental-Weber, J. Wu, S.X. Li, R. E. Jones, J.D. Denlinger, "Structure and electronic properties of InN and In-rich group III-nitride alloys", J. Phys. D: Appl. Phys. 39 (2006); pp. R39-R99.

Alexander H. Mueller, Melissa A. Petruska, Marc Achermann, Donald J. Werder, Elshan A. Akhadov, Daniel D. Koleske, Mark A. Hoffbauer, Victor I. Klimov, "Multicolor Light-Emitting Diodes Based on Semiconductor Nanocrystals Encapsulated in GaN Injection Layers", Nano Letters, vol. 5, No. 6, 2005; pp. 1039-1044.

Omkar Jani, Christiana Honsberg, Ali Asghar, David Nicol, Ian Ferguson, Alan Doolittle, Sarah Kurtz, "Characterization and analysis of InGaN photovoltaic devices", Presented at the $31^{st}$ IEEE Pholovoltiac Specialists Conference, Jan. 3-7, 2005; 6 Pgs.

Omkar Jani, Christiana Honsberg, Yong Huang, June-O Song, 'Ian Ferguson, Gon Namkoong, Elaissa Trybus, Alan Doolittle, Sarah Kurtz, "Design, growth, fabrication and characterization of high-band gap InGaN/GaN solar cells", IEEE, 2006; pp. 20-25.

A.K. Srivastava, J.L. Zyskind, R.M. Lum, B.V. Dutt, J.K. Klingert, "Electrical characteristics of InAsSb/GaSb heterojunctions", Appl. Phys. Lett. 49 (1), Jul. 7, 1986; pp. 41-43.

H. Sakaki, L.L. Chang, R. Ludeke, Chin-An Chang, G.A. Sai-Halasz, L. Esaki, "$In_{1-x}Ga_xAs$-$GaSb_{1-y}As_y$ heterojunctions by molecular bean epitaxy", Applied Physics Letters, vol. 31, No. 3, Aug. 1, 1977, pp. 211-213.

* cited by examiner

SINGLE P-N JUNCTION TANDEM PHOTOVOLTAIC DEVICE

CROSS REFERENCE TO RELATED APPLICATION(S)

This application claims priority to U.S. Provisional Patent Application Ser. No. 60/945,281, entitled "Single P-N Junction Tandem Photovoltaics," filed on Jun. 20, 2007, the contents of which are incorporated herein by reference.

STATEMENT OF GOVERNMENTAL INTEREST

The invention described and claimed herein was made in part utilizing funds supplied by the U.S. Department of Energy under Contract No. DE-AC02-05CH11231. The government has certain rights in this invention.

BACKGROUND OF THE INVENTION

1. Field of the Invention

The disclosure relates to solar cells are more particularly to a single junction tandem solar cell.

2. Background Discussion

Solar or photovoltaic cells are semiconductor devices having P-N junctions which directly convert radiant energy of sunlight into electrical energy. Conversion of sunlight into electrical energy involves three major processes: absorption of sunlight into the semiconductor material; generation and separation of positive and negative charges creating a voltage in the solar cell; and collection and transfer of the electrical charges through terminals connected to the semiconductor material. A single depletion region for charge separation typically exists in the P-N junction of each solar cell.

Current traditional solar cells based on single semiconductor material have an intrinsic efficiency limit of approximately 31%. A primary reason for this limit is that no one material has been found that can perfectly match the broad ranges of solar radiation, which has a usable energy in the photon range of approximately 0.4 to 4 eV. Light with energy below the bandgap of the semiconductor will not be absorbed and converted to electrical power. Light with energy above the bandgap will be absorbed, but electron-hole pairs that are created quickly lose their excess energy above the bandgap in the form of heat. Thus, this energy is not available for conversion to electrical power.

Higher efficiencies have been attempted to be achieved by using stacks of solar cells with different band gaps, thereby forming a series of solar cells, referred to as "multijunction," "cascade," or "tandem" solar cells. Tandem solar cells are the most efficient solar cells currently available. Tandem cells are made by connecting a plurality (e.g., two, three, four, etc.) P-N junction solar cells in series. Tandem cells are typically formed using higher gap materials in the top cell to convert higher energy photons, while allowing lower energy photons to pass down to lower gap materials in the stack of solar cells. The bandgaps of the solar cells in the stack are chosen to maximize the efficiency of solar energy conversion, where tunnel junctions are used to series-connect the cells such that the voltages of the cells sum together. Such multijunction solar cells require numerous layers of materials to be formed in a complex, stacked arrangement.

SUMMARY

In accordance with one or more embodiments, a single P-N junction solar cell is provided having multiple regions for charge separation while allowing the electrons and holes to recombine such that the voltages associated with both depletion regions of the solar cell will add together. In one or more embodiments, the conduction band edge (CBE) of a top layer in the solar cell is formed to line up with the valence band edge (VBE) of a lower layer in the solar cell.

In accordance with one or more embodiments, a solar cell is provided having an alloy of either InGaN or InAlN formed on one side of the P-N junction with Si formed on the other side in order to produce characteristics of a two junction (2J) tandem solar cell through a single P-N junction. In one embodiment, an $In_{1-x}Ga_xN$ alloy is utilized, while in another embodiment $In_{1-x}Al_xN$ is utilized. A single P-N junction solar cell formed in accordance with one or more embodiments will achieve power conversion efficiencies exceeding 30%.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

Figure 1:
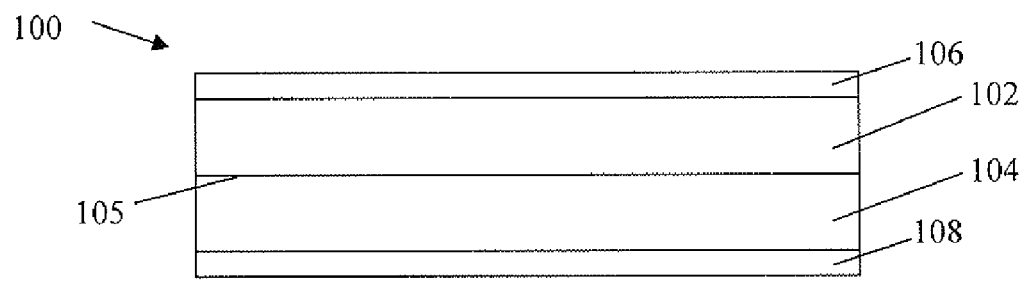
FIG. 1 is a block diagram representation of a single P-N junction tandem solar cell in accordance with one or more embodiments of the present disclosure.

In general, the present disclosure includes a single P-N junction tandem photovoltaic device. Certain embodiments of the present disclosure will now be discussed with reference to the aforementioned figures, wherein like reference numerals refer to like components.

Referring now to FIG. 1, a block diagram illustration of a single P-N junction tandem solar cell 100 is shown generally in accordance with one or more embodiments. One of the layers 102 and 104 is formed as a p-type material while the other of the layers 102 and 104 is formed as an n-type material, such that a single P-N junction 105 exists between the layers 102 and 104. Each of the layers 102 and 104 can also be described and/or formed as its own subcell within the solar cell 100. In one or more embodiments, the conduction band edge (CBE) of the top layer 102 in the solar cell is formed to line up with the valence band edge (VBE) of the lower layer 104 in the solar cell 100. In one embodiment, the solar cell 100 includes a layer 102 of a Group III-nitride alloy and a Si layer 104. Electrical contacts 106 and 108 are formed, respectively, on the top of or otherwise coupled to the Group III-nitride alloy layer 102 and on the bottom of or otherwise coupled to the Si layer 104. In one or more embodiments, the top electrical contact 106 should be formed from a substantially transparent conductive material so as to allow solar radiation to travel past the electrical contact 106 to enter into the solar cell 100, such as by forming the contact 106 as Indium-Tin-Oxide or other suitable substantially transparent conductive material or a grid of other metal layers. The electrical contacts 106 and 108 are formed in accordance with methods known to those skilled in the art of manufacturing solar cells.

In one embodiment, the layer 102 is an alloy of $In_{1-x}Ga_xN$, where $0 \leq x \leq 1$, having an energy bandgap range of approximately 0.7 eV to 3.4 eV, providing a good match to the solar energy spectrum. In another embodiment, the layer 102 is an alloy of $In_{1-x}Al_xN$, where $0 \leq x \leq 1$, having an energy bandgap range of approximately 0.7 eV to 6.0 eV, also providing a good match to the solar energy spectrum. In one or more embodiments, the layer 102 is grown by molecular beam epitaxy creating crystals with low electron concentrations and high electron mobilities, while it is understood that other formation methods can further be utilized. For ease of description in the various embodiments described herein, the layer 102 will be referred to as InGaN layer 102, while it is understood that InAlN can interchangeably be substituted in place of InGaN in the various embodiments described herein.

In one or more embodiments, the InGaN layer 102 is formed as a p-type layer by doping the InGaN layer 102 with a p-type dopant, such as magnesium (Mg), while a thin Si interface layer is counter-doped with a p-type dopant such as Boron (B), Aluminum (Al), Gallium (Ga) or Indium (In). The rest of the Si layer 104 is formed as an n-type layer by doping the Si layer 104 with an n-type dopant, such as phosphorous (P), arsenic (As) or antimony (Sb). Typical doping levels for n-type and p-type layers range from $10^{15}$ cm$^{-3}$ to $10^{19}$ cm$^{-3}$. The actual doping levels depend on other characteristics of the layers 102 and 104 of the solar cell 100 and can be adjusted within and outside of this range to maximize the efficiency. It is understood that the P-N junction 105 can also be formed by doping the InGaN layer 102 with an n-type dopant and doping the Si layer 104 with a p-type dopant. Silicon is commonly used as an n-type dopant and magnesium as a p-type dopant in InGaN.

As grown, undoped InGaN films are generally n-type, where in one embodiment the InGaN layer 102 can be doped with Mg acceptors so that the InGaN layer 102 behaves as a p-type. In one specific embodiment, a Mg p-type dopant is used in alloy of $In_yGa_{1-y}N$ where $0.67 \leq y \leq 0.95$.

Figure 2:
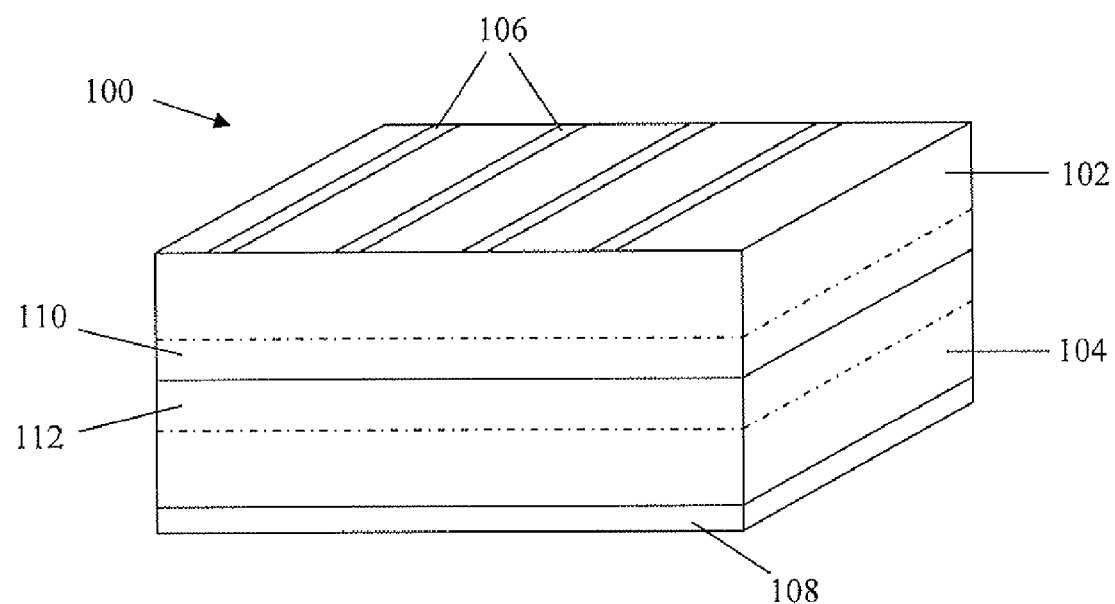
FIG. 2 is a more detailed perspective view of FIG. 1 showing the various regions in a single P-N junction tandem solar cell in accordance with one or more embodiments of the present disclosure.

While the P-N junction 105 can be simply formed as represented in FIG. 1 with an InGaN layer 102 positioned against a Si layer 104. In actuality, a plurality of depletion regions will be formed across the P-N junction 105 when the junction 105 is in thermal equilibrium and in a steady state. Electrons and holes will diffuse into regions with lower concentrations of electrons and holes, respectively. Thus, the excess electrons in the n-type Si layer 104 will diffuse into the P-side of the P-N junction 105 while the excess holes in the p-type InGaN layer 102 will diffuse into the N-side of the P-N junction 105. As illustrated in FIG. 2, this will create an InGaN depletion region 110 in the InGaN layer 102 adjacent to the P-N junction 105 and a Si depletion region 112 in the Si layer 104 adjacent to the P-N junction 105.

When the solar cell 100 is exposed to solar energy, energy transfers from photons in the solar energy to the solar cell 100 when the layers 102 and 104 absorb lightwaves that contain the same amount of energy as their bandgap. A bandgap is the energy required to push an electron from a material's valence band to its conduction band. Based upon an experimental measurement of a 1.05±0.25 eV valence band offset between InN and GaN and the known electron affinity of GaN, InN is predicted to have an electron affinity of 5.8 eV, the largest of any known semiconductor. Forming the layer 102 as an alloy of InGaN or InAlN allows a wide bandgap tuning range, 0.7 to 3.4 eV for InGaN and 0.7 to 6.0 eV for InAlN.

Figure 3:
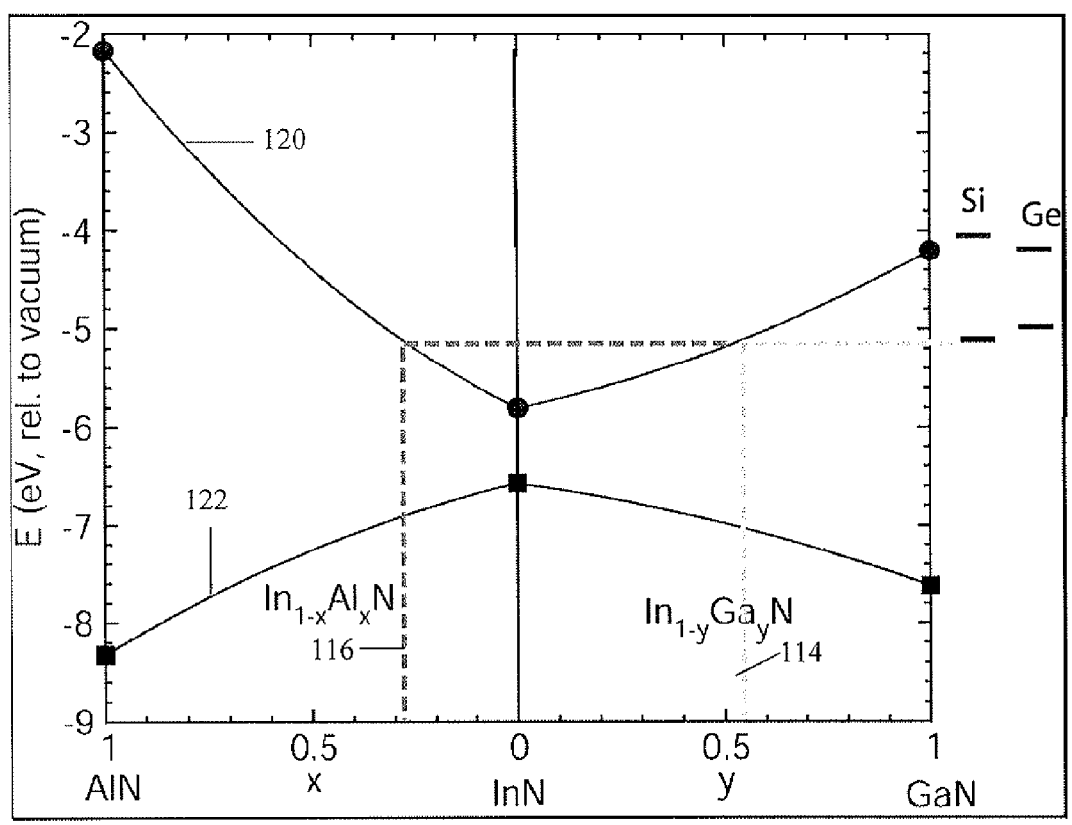
FIG. 3 is a graphical illustration of a band diagram for the heterojunction of a single P-N junction tandem solar cell in accordance with one or more embodiments of the present disclosure.

By aligning the conduction band of one of the layers 102 or 104 with the valence band of the other one of the layers 102 or 104, a low resistance tunnel junction is produced between the layers 102 and 104. The conduction band edge 120 and valence band edge 122 positions of InGaN and InAlN are illustrated in FIG. 3, where the dotted lines 114 and 116 indicate the compositions (e.g., approximately $In_{0.7}Al_{0.3}N$ or $In_{0.5}Ga_{0.5}N$) that align the conduction band of InGaN and InAlN, respectively, with the valence band of Si. A composition with slightly more Ga or Al will align the conduction band of InGaN/InAlN with the valence band of Ge. As shown in FIG. 3, the electron affinity (energy position of the conduction band minimum (CBM) with respect to the vacuum level) can also be tuned over a wide range, 5.8 eV to 2.1 eV in InAlN and 5.8 eV to 4.2 eV in InGaN. In one embodiment, for the composition of approximately $Al_{0.3}In_{0.7}N$ or $In_{0.45}Ga_{0.55}N$, the conduction band of AlInN/InGaN can be made to align with the valence band of Si, creating the conditions for a very low resistance tunnel between the layers 102 and 104 without the requirement of additional heavily doped layers as typically required in previous multijunction solar cells, which greatly simplifies the design of the present single junction tandem solar cell 100 over previous multi-junction solar cells.

The solar cell 100 having a single P-N junction 105 between the p-type layer 102 (InGaN or InAlN) and the n-type Si layer 104 provides: (1) two depletion regions for charge separation and (2) a junction 105 that allows electrons and holes to recombine such that the voltages generated from the solar energy in both of the layers 102 and 104 will add together. These types of observations have only previously been attainable in multijunction tandem solar cells with tunnel junction layers and never previously attainable using only a single P-N junction.

The single p-InGaN/n-Si heterojunction of the solar cell 100 behaves in a fundamentally different manner than a usual P-N semiconductor heterojunction. In a normal P-N junction, holes are depleted on the p-type side and electrons are depleted on the n-type side, creating a single depletion region. However, the present p-InGaN/n-Si heterojunction (or p-In-AlN/n-Si heterojunction) formed in accordance with one or more embodiments produces two depletion regions. Under illumination, both of these depletion regions can separate charge, such that a single p-InGaN/n-Si or p-InAlN/n-Si heterojunction functions as a two-junction tandem solar cell. Further, at the junction 105 between the layers 102 and 104, there is type inversion (excess electrons on the InGaN side of the junction 105 and excess holes on the Si side of the junction 105), thereby creating the InGaN depletion region 110 and the Si depletion region 112. This type inversion provides a more efficient electron-hole annihilation and series connection of the layers 102 and 104.

Figures 4A, 4B:
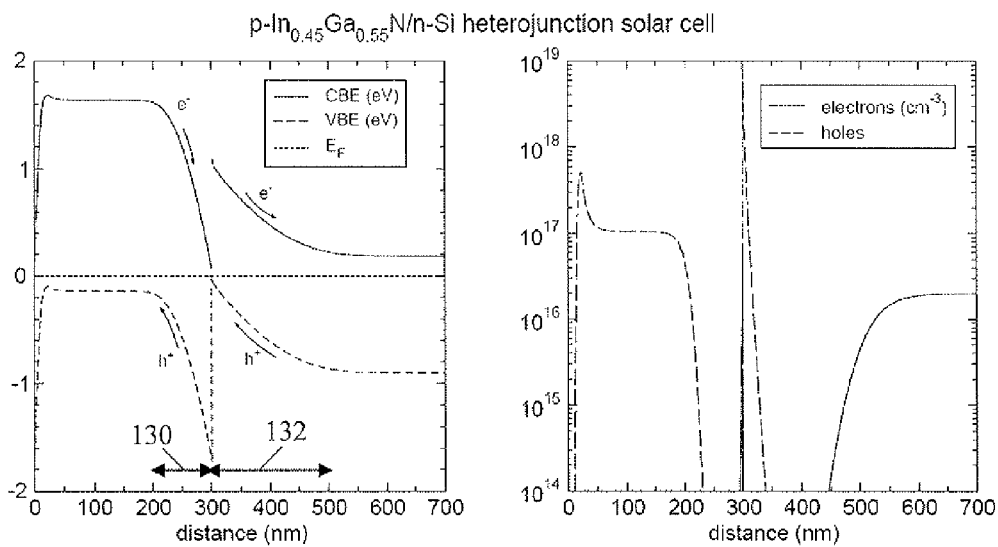
FIGS. 4A and 4B are graphical illustrations of the calculated (a) band diagram and (b) electron and hole concentrations for the heterojunction of a single P-N junction tandem solar cell in accordance with one or more embodiments of the present disclosure.

For one embodiment having a p-type $In_{0.45}Ga_{0.55}N$ layer 102 and an n-type Si layer 104, the calculated band diagram and electron and hole concentrations for such a p-InGaN/n-Si heterojunction tandem solar cell are respectively illustrated in FIGS. 4A and 4B. The two depletion regions 130 and 132 can be seen in FIG. 4A that correspond to depletion regions 110 and 112 shown in FIG. 2. A InGaN bandgap of 1.8 eV was obtained by specifying the composition, which is close to the ideal for a top layer 102 matched to a bottom Si layer 104 having a band gap=1.1 eV in terms of maximum power conversion efficiency.

Under illumination, photons with energies greater than the 1.8 eV band gap of the $In_{0.45}Ga_{0.55}N$ layer 102 create electron-hole pairs in the InGaN layer 102. The Si layer 104 absorbs light with energies between 1.1 and 1.8 eV and light with energy >1.8 eV that is not absorbed by the top InGaN layer 102. Doping in both of the layers 102 and 104 can be adjusted to change the size of the depletion regions 130 and 132. Efficient electron and hole recombination occurs at the InGaN/Si junction 105 such that under illumination, holes will go to the surface of the InGaN layer 102 and electrons will go into the Si layer 104. A thin (~25 nm) heavily doped p++ layer can be used to provide an ohmic contact to the InGaN surface.

The depletion regions 130 and 132 are similar to "Schottky-like" depletion regions found in semiconductor materials, such that these two depletion regions 130 and 132 should achieve efficiency of in the solar cell 100 of approximately 42% for unconcentrated sunlight, similar to the efficiency achieved by 2J tandem cells.

Figures 5A, 5B:
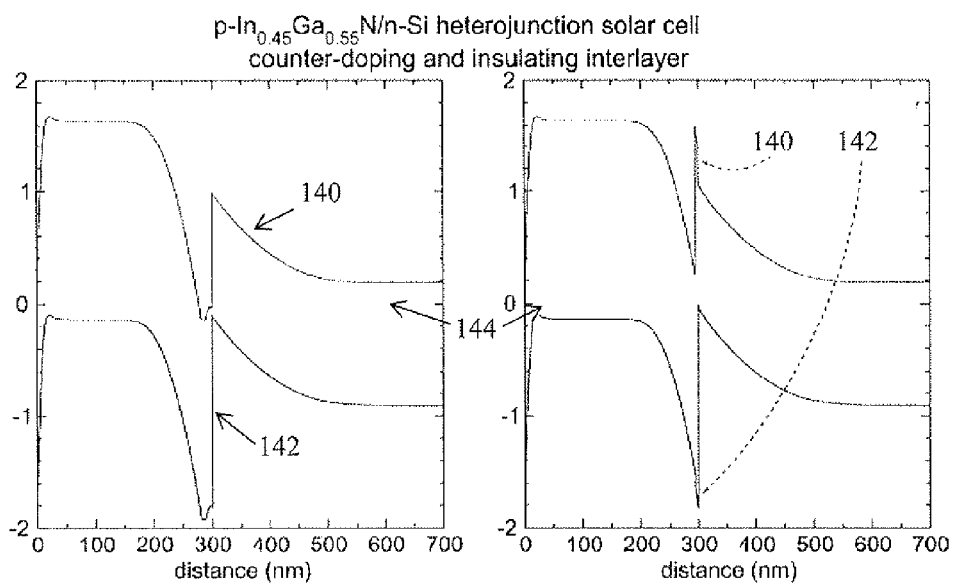
FIGS. 5A and 5B are graphical illustrations of the calculated band diagram for the heterojunction of a single P-N junction tandem solar cell with (a) counterdoping and (b) an insulating interlayer at the interface in accordance with one or more embodiments of the present disclosure.
Figure 6A:
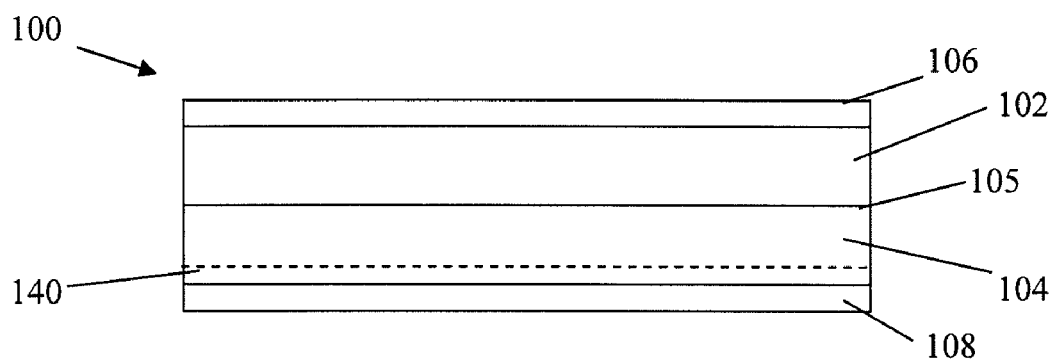
FIGS. 6A and 6B are block diagram representations of a single P-N junction tandem solar cell having heavily counterdoped regions in accordance with one or more embodiments of the present disclosure.
Figure 6B:
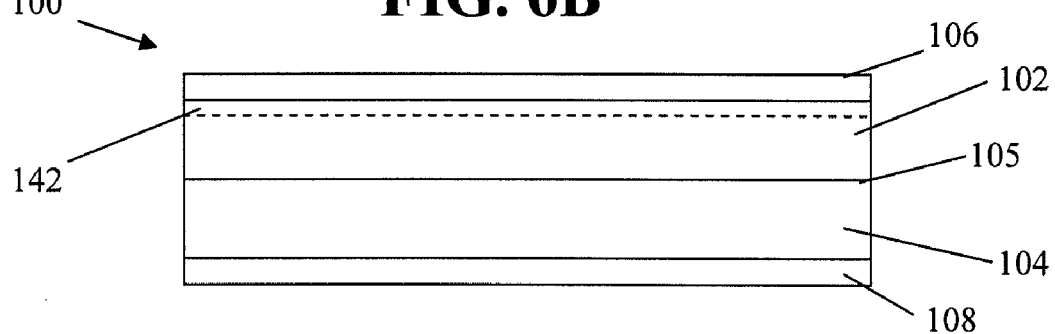

In one or more embodiments, the dark current (i.e., the output current of the solar cell 100 when no light is acting as an input) can be reduced by heavy counter-doping (i.e., $p^{++}$ counter-doping 140 in the n-type layer 104 as illustrated in FIG. 6A or $n^{++}$ counter-doping 142 in the p-type layer 102 as illustrated in FIG. 6B) near the interface between at least one of the layers 102, 104 and the respective one of the electrical contacts 106, 108. This will also increase the open circuit voltage and efficiency of the solar cell 100. Referring to FIG. 5A, a band diagram for a p-InGaN/n-Si heterojunction tandem solar cell is illustrated in which $n^{++}$ counter-doping 142 (e.g., a 10 nm layer of $n^{++}$ $9 \times 10^{17}$) has been utilized in the p-type layer 102 adjacent to electrical contact 106, where line 140 represents CBE (eV), line 142 represents VBE (eV) and line 144 represents $E_F$.

Figure 6C:
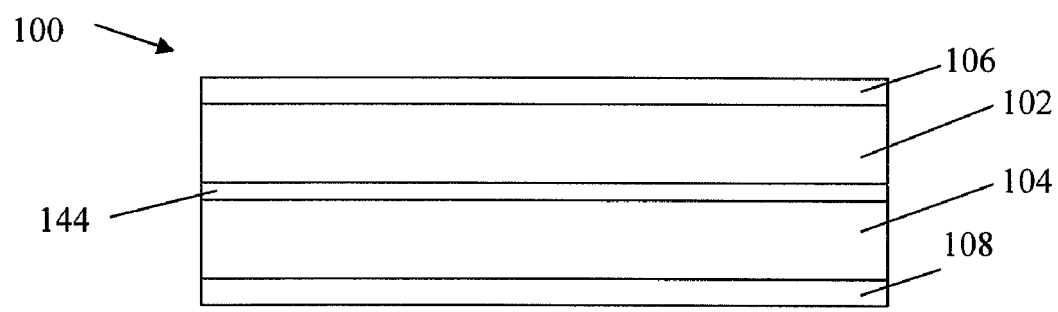
FIG. 6C is a block diagram representation of a single P-N junction tandem solar cell having an insulating interlayer in accordance with one or more embodiments of the present disclosure.

In one or more embodiments, the dark current can be reduced and the open circuit voltage increased through the use of a thin insulating interlayer 144 (e.g., a thin layer of GaN) formed between the layers 102 and 104, as illustrated in FIG. 6C. The interlayer 144 will serve to increase the barrier for hole leakage from the p-InGaN layer 102 into the n-Si layer 104 while preventing electron leakage from the n-Si layer 104 into the p-InGaN layer 102. Referring to FIG. 5B, a band diagram for a p-InGaN/n-Si heterojunction tandem solar cell is illustrated in which a thin 5 nm GaN interlayer 144 has been utilized between the p-InGaN layer 102 and the n-Si layer 104.

Both of the approaches associated with reducing dark current using heavy counter-doping or a thin insulating layer illustrated in FIGS. 5A and 5B will increase the barrier against electron and hole leakage by about 0.1 to 0.2 eV compared designs without such features.

In order to form a tandem photovoltaic device using a single P-N junction, the conduction band minimum (CBM) in the upper layer 102 of the solar cell 100 is formed to be substantially aligned with or lower in energy with respect to the vacuum level than the valence band maximum (VBM) of the lower layer 104 of the solar cell 100. The present disclosure allows a solar cell having the efficiency characteristics of a two-junction tandem solar cell to be made with a very simple single P-N junction design. By simply forming a p-InGaN layer 102, which can be thin (<0.5 μm), over a bottom n-Si layer 104, a tandem solar cell 100 can be produced with an efficiency above that of the best currently produced single junction Si solar cells. In one or more embodiments, the Si layer 104 can be formed using polycrystalline, multicrystalline or even amorphous Si. Such a tandem solar cell 100 can be produced with increased efficiency and lower costs compared to previously-known Si technology, which could revolutionize photovoltaics manufacturing.

The invention claimed is:

1. A solar cell, comprising:
   a p-type layer comprising InGaN;
   an n-type layer comprising Si;
   a single p-n junction between the p-type layer and the n-type layer;
   a charge separation region for charge separation under illumination formed in the p-type layer having a first band gap; and
   a charge separation region for charge separation under illumination formed in the n-type layer having a second band gap, wherein the second band gap is different from the first band gap,
   wherein each of the charge separation regions in the p-type and n-type layers are formed to separate charge under illumination separately from one another,
   wherein the solar cell includes a plurality of charge separation regions for charge separation associated with the single p-n junction, and wherein a conduction band of one of the p-type and n-type layers substantially aligns with a valence band in the other of the p-type and n-type layers to form the p-n junction as a low resistance tunnel junction between the p-type layer and the n-type layer.

2. The solar cell of claim 1, wherein the solar cell includes two depletion regions.

3. The solar cell of claim 1, wherein voltages produced in each of the charge separation regions will add together to produce a combined output voltage for the solar cell.

4. The solar cell of claim 1, wherein the InGaN alloy comprises $In_{1-x}Ga_xN$, where $0 \leq x \leq 1$.

5. The solar cell of claim 4, wherein x is approximately 0.5.

6. The solar cell of claim 1, further comprising:
   a first electrical contact coupled to the p-type layer; and
   a second electrical contact coupled to the n-type layer.

7. The solar cell of claim 6, further comprising a heavily counter-doped region in at least one of the p-type layer and the n-type layer respectively adjacent to at least one of the first and second electrical contacts.

8. The solar cell of claim 1, further comprising an insulating interlayer between the p-type layer and the n-type layer.

9. The solar cell of claim 1, wherein one of the p-type and n-type layers possesses a band gap that is larger than a band gap of the other of the p-type and n-type layers such that each of the charge separation regions absorb different respective portions of the solar spectrum, wherein a conduction band edge of one of the p-type and n-type layers including the charge separation region with the larger band gap is substantially aligned with a valence band edge of the other of the p-type and n-type layers including the charge separation region with the smaller band gap.

10. The solar cell of claim 1, wherein a conduction band edge (CBE) of the p-type InGaN alloy is substantially aligned with a valence band edge (VBE) in the n-type Si layer.

11. A solar cell, comprising:
a p-type layer comprising InGaN;
a first electrical contact coupled to the p-type layer;
an n-type layer comprising Si;
a second electrical contact coupled to the n-type layer; and
a single p-n junction between the p-type layer and the n-type layer having separate charge separation regions for charge separation formed on both sides of the single p-n junction in respective portions of the p-type layer and the n-type layer,
each of the p-type layer and the n-type layer possessing a different band gap such that each charge separation region will absorb different respective portions of the solar spectrum to separate charge under illumination separately from the other of the charge separation regions,
wherein a conduction band of one of the p-type and n-type layers substantially aligns with a valence band in the other of the p-type and n-type layers to form the p-n junction as a low resistance tunnel junction between the p-type and the n-type layers.

12. The solar cell of claim 11, wherein one of the p-type and n-type layers possesses a band gap that is larger than a band gap of the other of the p-type and n-type layers such that each of the charge separation regions absorb different respective portions of the solar spectrum, wherein a conduction band edge of one of the p-type and n-type layers including the first charge separation region is substantially aligned with a valence band edge of the other of the p-type and n-type layers including the second charge separation region.

13. A single junction solar cell, comprising:
a single p-n junction between a p-type subcell comprising InGaN and an n-type subcell comprising Si having a plurality of independent charge separation regions for charge separation,
each of the charge separation regions are located in a material possessing a different respective band gap such that each charge separation region will absorb different respective portions of the solar spectrum under illumination,
wherein a conduction band of one of the p-type and n-type subcells substantially aligns with a valence band in the other of the p-type and n-type subcells to form the p-n junction as a low resistance tunnel junction between the p-type and the n-type subcells.

14. The solar cell of claim 13, wherein the p-type subcell is a layer of p-type material.

15. The solar cell of claim 13, wherein the n-type subcell is a layer of n-type material.

16. The solar cell of claim 13, wherein one of the p-type and n-type layers possesses a band gap that is larger than a band gap of the other of the p-type and n-type layers such that each of the charge separation regions absorb different respective portions of the solar spectrum, wherein a conduction band edge of one of the p-type and n-type subcells including the first charge separation region is substantially aligned with a valence band edge of the other of the p-type and n-type subcells including the second charge separation region.

17. A method of forming a single junction solar cell, comprising:
arranging a p-type layer comprising InGaN adjacent to an n-type layer comprising Si to form a single p-n junction between the p-type layer and the n-type layer; and
forming separate charge separation regions for charge separation on both sides of the single p-n junction for independently performing charge separation under illumination, and wherein a conduction band of one of the p-type and n-type layers substantially aligns with a valence band in the other of the p-type and n-type layers to form the p-n junction as a low resistance tunnel junction between the p-type layer and the n-type layer.

18. The method of claim 17, further comprising coupling a first electrical contact coupled to the p-type layer and a second electrical contact coupled to the n-type layer.

19. The method of claim 17, further comprising:
forming the p-type layer from an alloy selected from one of InGaN and InAlN; and
forming the n-type layer from Si.

20. The method of claim 18, further comprising forming a heavily counter-doped region in at least one of the p-type layer and the n-type layer respectively adjacent to at least one of the first and second electrical contacts.

21. The method of claim 17, further comprising forming an insulating interlayer between the p-type layer and the n-type layer.

22. The method of claim 17, further comprising forming each of the p-type layer and the n-type layer to possess a different band gap such that each of the charge separation regions absorb different respective portions of the solar spectrum.

* * * * *